United States Patent
Kusama et al.

(10) Patent No.: US 9,497,863 B2
(45) Date of Patent: Nov. 15, 2016

(54) WIRING SUBSTRATE AND METHOD OF MAKING WIRING SUBSTRATE

(71) Applicant: SHINKO ELECTRIC INDUSTRIES CO., LTD., Nagano (JP)

(72) Inventors: Yasuhiko Kusama, Nagano (JP); Hideyuki Tako, Nagano (JP); Kenji Kawai, Nagano (JP); Fumihisa Miyasaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/625,809

(22) Filed: Feb. 19, 2015

(65) Prior Publication Data

US 2015/0257274 A1 Sep. 10, 2015

(30) Foreign Application Priority Data

Mar. 5, 2014 (JP) ................. 2014-043318

(51) Int. Cl.
*H05K 1/18* (2006.01)
*H05K 3/30* (2006.01)
(Continued)

(52) U.S. Cl.
CPC ............... *H05K 1/185* (2013.01); *H01L 23/13* (2013.01); *H01L 23/49822* (2013.01); *H05K 3/0011* (2013.01); *H05K 3/301* (2013.01); *H01L 23/145* (2013.01); *H01L 23/49894* (2013.01); *H01L 24/16* (2013.01); *H01L 24/32* (2013.01); *H01L 24/73* (2013.01); *H01L 2224/16235* (2013.01); *H01L 2224/16237* (2013.01); *H01L 2224/16265* (2013.01); *H01L 2224/32225* (2013.01); *H01L 2224/73204* (2013.01); *H01L 2924/15313* (2013.01); *H05K 3/007* (2013.01); *H05K 3/0032* (2013.01); *H05K 3/4602* (2013.01); *H05K 2201/09063* (2013.01); *H05K 2201/09154* (2013.01); *H05K 2201/10522* (2013.01); *H05K 2201/10636* (2013.01); *H05K 2201/10651* (2013.01); *H05K 2203/1105* (2013.01); *H05K 2203/1316* (2013.01); *H05K 2203/167* (2013.01); *Y02P 70/611* (2015.11); *Y10T 29/49146* (2015.01)

(58) Field of Classification Search
CPC .... H05K 1/185; H05K 3/0011; H05K 3/301; H05K 2203/1316
USPC .......................................... 174/260; 29/841
See application file for complete search history.

(56) References Cited

U.S. PATENT DOCUMENTS 7,876,577 B2   1/2011 Weber et al.
2011/0240354 A1* 10/2011 Furuhata ............... H01L 21/568
                                                 174/258

(Continued)

FOREIGN PATENT DOCUMENTS

JP         2011-216740        10/2011

OTHER PUBLICATIONS

Office Action mailed on Feb. 24, 2016 issued with respect to the related U.S. Appl. No. 14/634,972.

*Primary Examiner* — Timothy Thompson
*Assistant Examiner* — Charles Pizzuto
(74) *Attorney, Agent, or Firm* — IPUSA, PLLC

(57) ABSTRACT

A wiring substrate includes a core layer having a hole penetrating therethrough in a thickness direction thereof, and having a projecting part projecting from an inner wall of the hole toward an inner space of the hole, a plurality of electronic components disposed in the hole and arranged side by side at a spaced interval in a plan view, the electronic components having side portions thereof, the side portions being engaged with the projecting part, and a resin layer filling the hole and supporting the electronic components.

11 Claims, 8 Drawing Sheets

(51) Int. Cl.
*H05K 3/00* (2006.01)
*H01L 23/13* (2006.01)
*H01L 23/498* (2006.01)
*H05K 3/46* (2006.01)
*H01L 23/00* (2006.01)
*H01L 23/14* (2006.01)

(56) References Cited

U.S. PATENT DOCUMENTS

| | | |
|---|---|---|
| 2012/0080221 A1 | 4/2012 | Sekine |
| 2012/0287586 A1 | 11/2012 | Mikado et al. |
| 2013/0182401 A1 | 7/2013 | Furutani et al. |
| 2013/0192883 A1 | 8/2013 | Furutani et al. |
| 2013/0333930 A1* | 12/2013 | Koyanagi ............ H05K 1/184 174/258 |
| 2014/0144686 A1* | 5/2014 | Shimizu ............... H05K 1/185 174/258 |
| 2015/0068795 A1 | 3/2015 | Ida et al. |
| 2015/0245492 A1 | 8/2015 | Shimabe et al. |
| 2015/0257274 A1 | 9/2015 | Kusama et al. |
| 2015/0282305 A1 | 10/2015 | Shimabe et al. |
| 2015/0334844 A1 | 11/2015 | Shimabe et al. |

\* cited by examiner

WIRING SUBSTRATE AND METHOD OF MAKING WIRING SUBSTRATE

CROSS-REFERENCE TO RELATED APPLICATIONS

The present application is based upon and claims the benefit of priority from the prior Japanese Patent Application No. 2014-043318 filed on Mar. 5, 2014, with the Japanese Patent Office, the entire contents of which are incorporated herein by reference.

FIELD

The disclosures herein relate to a wiring substrate and a method of making a wiring substrate.

BACKGROUND

A certain type of wiring board is known in the art that has a substrate having a cavity formed therein and an electronic component disposed in the cavity. The wiring board further includes an insulating layer formed to cover the opening of the cavity (see Japanese Patent Application Publication No. 2011-216740, for example).

As described above, a related-art wiring board has a single electronic component disposed in a single cavity.

Placing a plurality of electronic components in a single cavity may give rise to a risk of causing the electronic components to be displaced at the time of filling the cavity with an insulating layer. Such displacement of the electronic components is associated with a risk of having short-circuiting caused by physical contact or a risk of having a failure to secure connection with a wiring layer, thereby creating a problem regarding electrical reliability.

SUMMARY

A wiring substrate includes a core layer having a hole penetrating therethrough in a thickness direction thereof, and having a projecting part projecting from an inner wall of the hole toward an inner space of the hole, a plurality of electronic components disposed in the hole and arranged side by side at a spaced interval in a plan view, the electronic components having side portions thereof, the side portions being engaged with the projecting part, and a resin layer filling the hole and supporting the electronic components.

A method of making a wiring substrate includes forming a hole penetrating through a core layer in a thickness direction thereof, the core layer having a projecting part projecting from an inner wall of the hole toward an inner space of the hole, disposing a plurality of electronic components in the hole such that the electronic components are arranged side by side at a spaced interval in a plan view, the electronic components having side portions thereof, the side portions being engaged with the projecting part, and filling the hole with resin material to form a resin layer that supports the electronic components.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, a description will be given of embodiments of a wiring substrate and a method of making a wiring substrate.

Figure 1A:
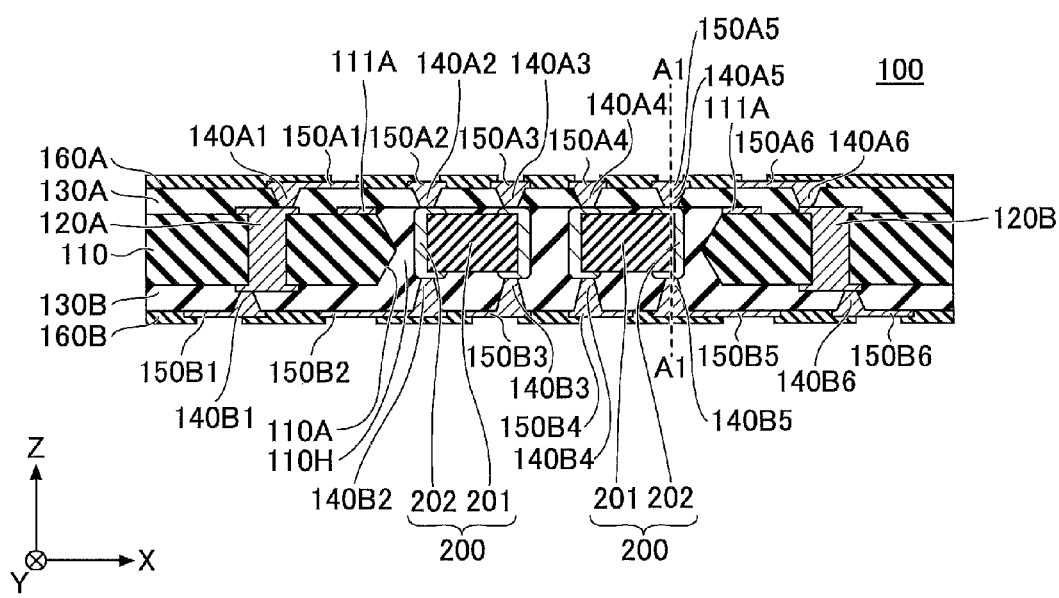
FIGS. 1A and 1B are cross-sectional views of a wiring substrate according to an embodiment.
Figure 1B:
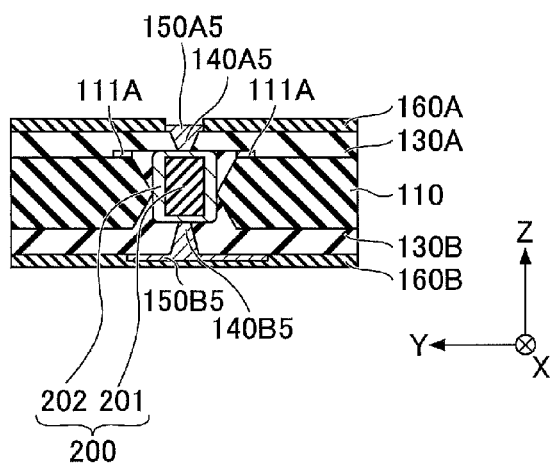

FIGS. 1A and 1B are cross-sectional views of a wiring substrate 100 according to an embodiment.

In the following, a description will be given by using an XYZ coordinate system having an XY plane parallel to a wiring substrate 100 wherein such a coordinate system is an example of an orthogonal coordinate system.

FIG. 1A illustrates a cross-sectional view of the wiring substrate 100 that is taken along a plane parallel to the XZ plane. FIG. 1B illustrates a cross-sectional view of the wiring substrate 100 that is taken along a plane A1-A1 parallel to the YZ plane in FIG. 1A and that is viewed from the negative X direction.

The wiring substrate 100 includes a core 110, a wiring layer 111A, through electrodes 120A and 120B, insulating layers 130A and 130B, and capacitor chips 200.

The wiring substrate 100 further includes vias 140A1, 140A2, 140A3, 140A4, 140A5, 140A6, 140B1, 140B2, 140B3, 140B4, 140B5, and 140B6.

The wiring substrate 100 further includes wiring layer segments 150A1, 150A2, 150A3, 150A4, 150A5, 150A6, 150B1, 150B2, 150B3, 150B4, 150B5, and 150B6, and also includes solder resist layers 160A and 160B.

In the following, for the sake of convenience of explanation, a surface facing upward in the drawings will be referred to as an upper surface, and a surface facing downward will be referred to as a lower surface. Moreover, terms "upward" and "downward" will be used for the sake of convenience of explanation. It may be noted, however, that terms such as "upper surface", "lower surface", "upward", "downward", "upper", and "lower" used in the description are not intended to indicate the permanent nature of upper and lower positions, but are simply used for the purpose of referring to upper and lower positions temporarily set in the drawings.

The core (i.e., core layer) 110 may be a glass cloth base material impregnated with epoxy resin having copper foils attached to the surfaces thereof, and serves as a core for a buildup substrate. One of the copper foils formed on the upper surface of the core 110 is patterned to form the wiring layer 111A. The other one of the copper foils formed on the lower surface of the core 110 may be patterned to form another wiring layer. If no wiring layer is necessary on the lower surface of the core 110, a copper foil suffices to be attached only to the upper surface of the core 110.

The core 110 has a penetrating hole 110H formed therein. The penetrating hole 110H penetrates through the core 110 in the thickness direction thereof (i.e., in the Z-axis direction in FIG. 1A). The inner wall of the penetrating hole 110H of the core 110 has a projecting part 110A that projects inwardly inside the penetrating hole 110H. The projecting part 110A will be explained later in connection with FIG. 2 and FIG. 3.

The wiring layer 111A is a metal layer formed on the upper surface of the core 110. The wiring layer 111A may be formed by pattering the copper foil attached to the upper surface of the core 110, for example. The wiring layer 111A has a hollow rectangular shape (i.e., rectangular loop shape) surrounding the opening of the penetrating hole 110H in a plan view (i.e., as viewed from above).

The through electrodes 120A and 120B are electrodes penetrating the core 110 in the thickness direction thereof. The through electrodes 120A and 120B are situated on opposite sides of the penetrating hole 110H, respectively. The through electrodes 120A and 120B are formed by filling with copper plating the through holes formed through the core 110 on the opposite sides of the penetrating hole 110H.

In this example, the through electrodes 120A and 120B have the configuration in which the through holes are filled with copper plating. Alternatively, through hole vias may be made by forming copper plating in a cylindrical shape on the inner wall of the through holes.

The insulating layer 130A is formed to cover the upper surfaces of the core 110, the wiring layer 111A, the through electrodes 120A and 120B, and the capacitor chips 200. The insulating layer 130A is formed by thermally curing a resin material such as an epoxy-based material or polyimide-based material through heating and application of pressure. It may be noted that the insulating layer 130A is formed after the insulating layer 130B is formed in the arrangement that is upside down relative to the arrangement illustrated in FIG. 1A.

The insulating layer 130B may be made by using the same resin material as the resin material such as an epoxy-based or polyimide-based material that is used to form the insulating layer 130A. The insulating layer 130B is formed to cover the lower surfaces of the core 110, the through electrodes 120A and 120B, and the capacitor chips 200 after filling the penetrating hole 110H with molten resin. The insulating layer 130B is formed by thermally curing a resin material such as an epoxy-based material or polyimide-based material through heating and application of pressure.

The vias 140A1, 140A2, 140A3, 140A4, 140A5, and 140A6 are formed inside via holes formed through the insulating layer 130A. The vias 140A1, 140A2, and 140A3 are connected to the through electrode 120A, an electrode 202 of the left-hand-side capacitor chip 200 on the left-hand side thereof, and another electrode 202 of the left-hand-side capacitor chip 200 on the right-hand side thereof, respectively.

The vias 140A4, 140A5, and 140A6 are connected to an electrode 202 of the right-hand-side capacitor chip 200 on the left-hand side thereof, another electrode 202 of the right-hand-side capacitor chip 200 on the right-hand side thereof, and the through electrode 120B, respectively. The vias 140A1, 140A2, 140A3, 140A4, 140A5, and 140A6 are formed by copper plating films, for example.

The vias 140B1, 140B2, 140B3, 140B4, 140B5, and 140B6 are formed inside via holes formed through the insulating layer 130B. The vias 140B1, 140B2, and 140B3 are connected to the through electrode 120A, an electrode 202 of the left-hand-side capacitor chip 200 on the left-hand side thereof, and another electrode 202 of the left-hand-side capacitor chip 200 on the right-hand side thereof, respectively.

The vias 140B4, 140B5, and 140B6 are connected to an electrode 202 of the right-hand-side capacitor chip 200 on the left-hand side thereof, another electrode 202 of the right-hand-side capacitor chip 200 on the right-hand side thereof, and the through electrode 120B, respectively. The vias 140B1, 140B2, 140B3, 140B4, 140B5, and 140B6 are formed by copper plating films, for example.

The wiring layer segments 150A1, 150A2, 150A3, 150A4, 150A5, and 150A6 are formed on the upper surface of the insulating layer 130A, and are connected to the vias 140A1, 140A2, 140A3, 140A4, 140A5, and 140A6, respectively. The wiring layer segments 150A1, 150A2, 150A3, 150A4, 150A5, and 150A6 are formed by copper plating films, for example.

The wiring layer segments 150B1, 150B2, 150B3, 150B4, 150B5, and 150B6 are formed on the lower surface of the insulating layer 130B, and are connected to the vias 140B1, 140B2, 140B3, 140B4, 140B5, and 140B6, respectively. The wiring layer segments 150B1, 150B2, 150B3, 150B4, 150B5, and 150B6 are formed by copper plating films, for example.

The solder resist layer 160A is formed on the insulating layer 130A and on the wiring layer segments 150A1, 150A2, 150A3, 150A4, 150A5, and 150A6. Portions of the wiring layer segments 150A1, 150A2, 150A3, 150A4, 150A5, and 150A6 that are exposed through the solder resist layer 160A are employed as terminals.

The solder resist layer 160B is formed beneath the insulating layer 130B and beneath the wiring layer segments 150B1, 150B2, 150B3, 150B4, 150B5, and 150B6. Portions of the wiring layer segments 150B1, 150B2, 150B3, 150B4, 150B5, and 150B6 that are exposed through the solder resist layer 160B are employed as terminals.

The capacitor chips 200 are an example of electronic components, and two of them are disposed inside the penetrating hole 110H. Each of the two capacitor chips 200 has a main body 201 and a pair of electrodes 202. The main body 201 is made of ceramic, for example, and supports the electrodes 202 disposed on opposite sides thereof, respectively. The permittivity of the capacitor chips 200 is determined by the material of the main body 201.

Each of the electrodes 202 is larger than the main body 201 in the YZ-plan view (i.e., as viewed from the X-axis direction) as illustrated in FIG. 1B, such that the electrode projects from the main body 201 in the positive Y direction and the negative Y direction as well as in the positive Z direction and the negative Z direction. Further, the electrodes 202 are formed to cover the surface of the main body 201 facing toward the positive X direction and the surface of the main body 201 facing toward the negative X direction, respectively. Namely, the electrodes 202 are formed in a cap shape to cover the main body 201 of a cuboid shape in the positive X direction and the negative X direction, respectively. The capacitor chips 200 each have a substantially cuboid shape, and are arranged side by side in the longitudinal direction thereof.

As illustrated in FIG. 1B, the capacitor chip 200 has the position-Y-direction-side surface and negative-Y-direction-side surface of the electrode 202 situated in engaging contact with the tips of the projecting part 110A, so that the capacitor chip 200 is held and supported by the projecting part 110A situated on the positive-Y-direction side and the projecting part 110A situated on the negative-Y-direction side.

Further, each of the capacitor chips 200 is supported on the side surfaces and lower surface thereof by the insulating layer 130B, and are supported on the upper surface thereof by the insulating layer 130A.

The two capacitor chips 200 are arranged side by side in the X-axis direction such that the two electrodes 202 of each of the capacitor chips 200 face toward the positive X direction and the negative X direction, respectively. The capacitor chips 200 are spaced apart and insulated from each other.

In the following, FIGS. 2A through 2C and FIGS. 3A through 3C will be referred to in order to describe the penetrating hole 110H of the core 110.

Figure 2A:
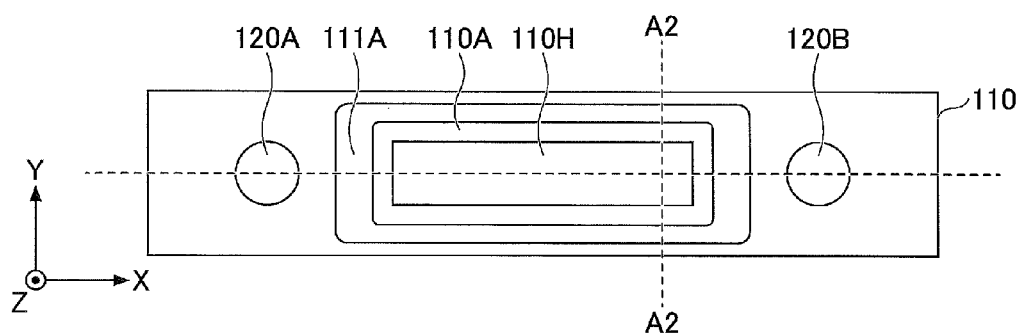
FIGS. 2A through 2C are cross-sectional views of a core.
Figure 2B:
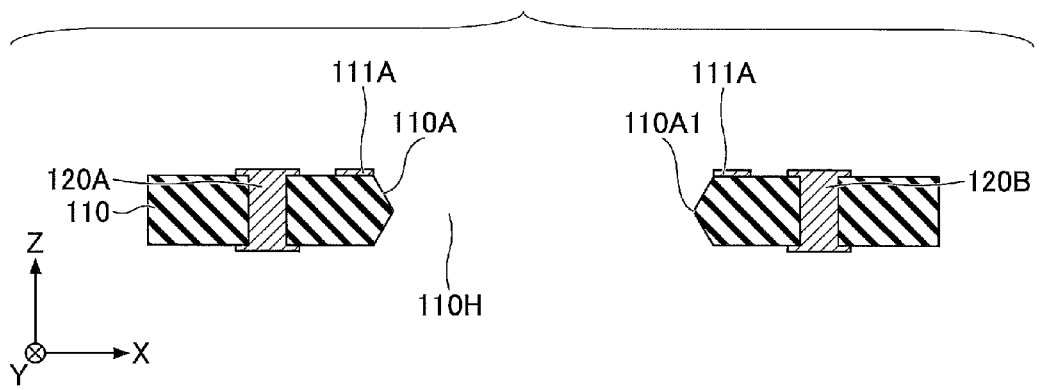
Figure 2C:
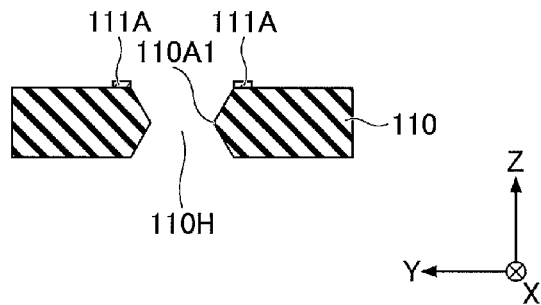

FIGS. 2A through 2C are cross-sectional views of the core 110. FIG. 2A is a plan view (i.e., a view of the XY plane). FIG. 2B is a cross-sectional view taken along a plane parallel to the XZ plane corresponding to FIG. 1A. FIG. 2C is a cross-sectional view that is taken along a plane parallel to the YZ plane corresponding to FIG. 1B and that illustrates a cross-section along a line A2-A2 in FIG. 2A as viewed from the negative X direction. FIGS. 2A through 2C illustrate the core 110 together with the wiring layer 111A and the through electrodes 120A and 120B.

As was previously described, the core 110 is formed of a glass-cloth base material impregnated with epoxy resin, and serves as a core for a buildup substrate. The core 110 has the penetrating hole 110H penetrating therethrough in the thickness direction.

The penetrating hole 110H has the inner wall thereof having the projecting part 110A. The projecting part 110A projects toward the inner space of the penetrating hole 110H in the plan view, and has a cross-section thereof formed in a tapered shape as illustrated in FIG. 2B and FIG. 2C. The projecting part 110A is formed on the inner wall of the penetrating hole 110H along the whole perimeter thereof.

The projecting part 110A having a tapered shape is configured such that the inner wall of the penetrating hole 110H is not vertical to extend in the Z-axis direction, but is formed at an angle smaller than 90 degrees relative to the upper surface and lower surface of the core 110, and such that the inner wall has the most projecting part at a general center thereof in the thickness direction of the core 110 projecting toward the inner space of the penetrating hole 110H.

The most projecting portion of the projecting part 110A toward the inner space of the penetrating hole 110H forms a ridge 110A1. The horizontal extent of the opening of the penetrating hole 110H increases from the ridge 110A1 toward the upper surface and lower surface of the core 110.

The projecting part 110A may be formed by making and shaping the penetrating hole 110H with a laser.

Figure 3A:
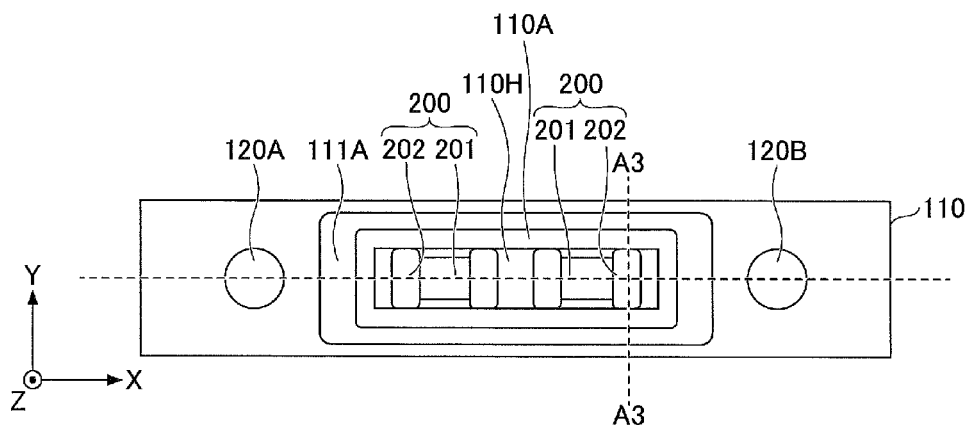
FIGS. 3A through 3C are drawings illustrating an arrangement in which capacitor chips are disposed in a penetrating hole of the core.
Figure 3B:
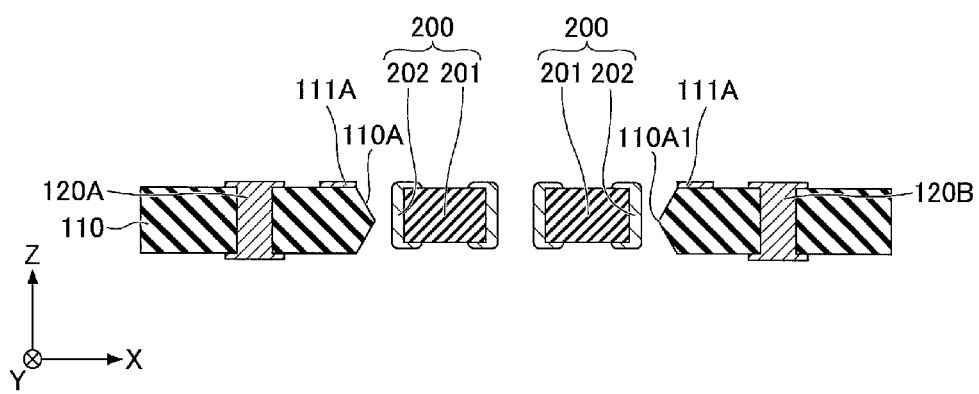
Figure 3C:
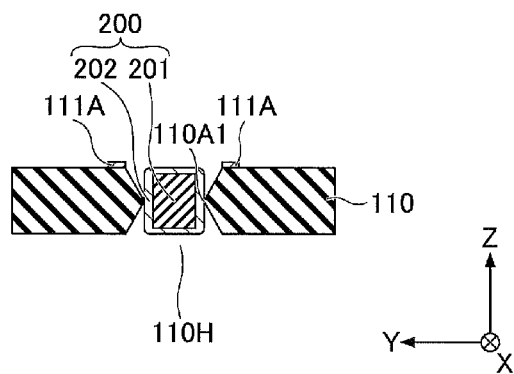

FIGS. 3A through 3C are drawings illustrating an arrangement in which the capacitor chips 200 are disposed in the penetrating hole 110H of the core 110. FIGS. 3A through 3C illustrate the arrangement before the insulating layers 130A and 130B are formed.

FIGS. 3A through 3C are a plan view and cross-sectional views corresponding to FIGS. 2A through 2C, respectively. FIG. 3C illustrates a cross-sectional view that is taken along a line A3-A3 in FIG. 3A and that is viewed from the negative X direction.

As illustrated in FIG. 3A, each of the capacitor chips 200 has the side surfaces of the electrodes 202 facing toward the positive Y direction and the side surfaces of the electrodes 202 facing toward the negative Y direction placed in engaging contact with the ridge of the projecting part 110A inside the penetrating hole 110H. With this arrangement, the capacitor chips 200 are supported by the projecting part 110A.

Inside the penetrating hole 110H, the ridge 110A1 of the projecting part 110A situated on the positive-Y-direction side and the ridge 110A1 of the projecting part 110A situated on the negative-Y-direction side are spaced apart by a distance that is slightly shorter than the width of the electrodes 202 of the capacitor chips 200 in the Y-axis direction.

For example, the distance in the Y-axis direction between the opposite ridges 110A1 may be 2 to 70 micrometers shorter than the width of the electrodes 202 of the capacitor chips 200 in the Y-axis direction.

Such an arrangement is provided for the purpose of holding by engaging contact (i.e., press fitting) the electrodes 202 between the ridges 110A1 opposing each other in the Y-axis direction. Especially, such an arrangement serves to suppress the movement of the capacitor chips 200 in the X-axis direction.

Since the capacitor chips 200 are arranged side by side in the X-axis direction, movement in the X-axis direction may cause the electrodes 202 to come in contact with each other to create short-circuiting, or may prevent the electrodes 202 from being properly connected to the vias 140A2 through 140A5 and 140B2 through 140B5.

Because of these reasons, the wiring substrate 100 of the present embodiment utilizes an arrangement such that the two capacitor chips 200 arranged side by side in a given direction have the surfaces thereof facing perpendicularly to the given direction placed in engaging contact with the projecting part 110A projecting from the inner wall of the penetrating hole 110H.

As was previously described, the capacitor chips 200 have the electrodes 202 that are wider in the Y-axis direction than the main body 201. The distance in the Y-axis direction between the ridges 110A1 is preferably wider than the width of the main body 201 in the Y-axis direction. The main body 201 serves to provide capacitance for the capacitor chips 200, and is designed to provide a predetermined permittivity. Avoiding contact with the ridge 110A1 and the projecting part 110A is preferable for the purpose of avoiding a risk of affecting the electrical characteristics of the capacitor chips 200.

Without the provision of the insulating layers 130A and 130B illustrated in FIGS. 1A and 1B, the capacitor chips 200 as disposed inside the penetrating hole 110H are held by the ridges 110A1 opposing each other in the Y-axis direction as illustrated in FIGS. 3A through 3C.

With a gap sufficient for insulating purposes being provided between the two capacitor chips 200, the length of the penetrating hole 110H in the X-axis direction as illustrated in FIG. 3A is set as follows. The length of the penetrating hole 110H in the X-axis direction is set such that a space is secured on the positive-X-direction side of the capacitor chip 200 situated toward the positive X direction, and, also, a space is secured on the native-X-direction side of the capacitor chip 200 situated toward the negative X direction.

The reason why spaces are provided in the positive-X-direction side and the negative-X-direction side of the two capacitor chips 200 is as follows. When the capacitor chips 200 are to be disposed inside the penetrating hole 110H from above the penetrating hole 110H, the provision of the above-noted spaces makes it easier to insert the capacitor chips 200 into the penetrating hole 110H. Further, the provision of such spaces serves to prevent the capacitor chips 200 from being obstructed by the inner walls of the penetrating hole 110H situated on the positive-X-direction side and on the negative-X-direction side.

The capacitor chips 200 may be transported in the X-axis direction above the core 110, and may then be disposed in the penetrating hole 110H. In such a case, the provision of the above-noted spaces ensures that the two capacitor chips 200 are reliably placed inside the penetrating hole 110H even if the positions of the capacitor chips 200 are slightly off their intended positions in the X-axis direction relative to the penetrating hole 110H.

In the following, a method of making the wiring substrate 100 of the present embodiment will be described. Further, a method of mounting an LSI (large scale integrated) circuit chip on the wiring substrate 100 will be described.

FIGS. 4A and 4B, FIGS. 5A through 5E, and FIGS. 6A through 6C illustrate the method of making the wiring substrate 100 of the present embodiment. Cross-sections described in the following correspond to the cross-sections illustrated in FIG. 1A, FIG. 2B, and FIG. 3B.

Figure 4A:
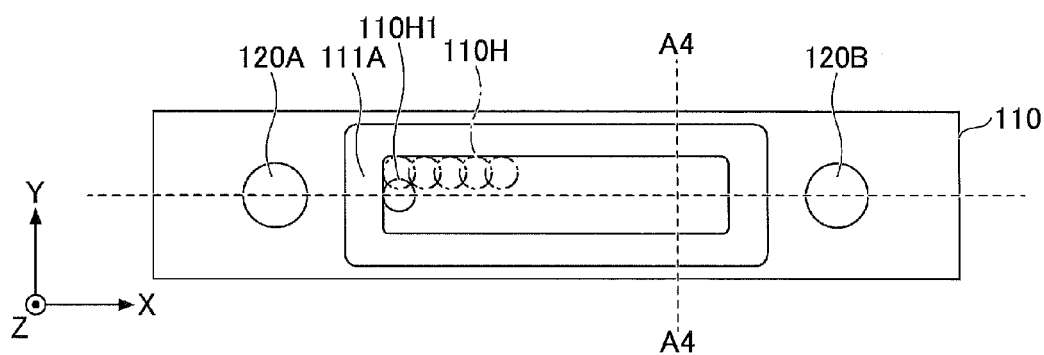
FIGS. 4A and 4B are drawings illustrating a method of making the wiring substrate of the embodiment.
Figure 4B:
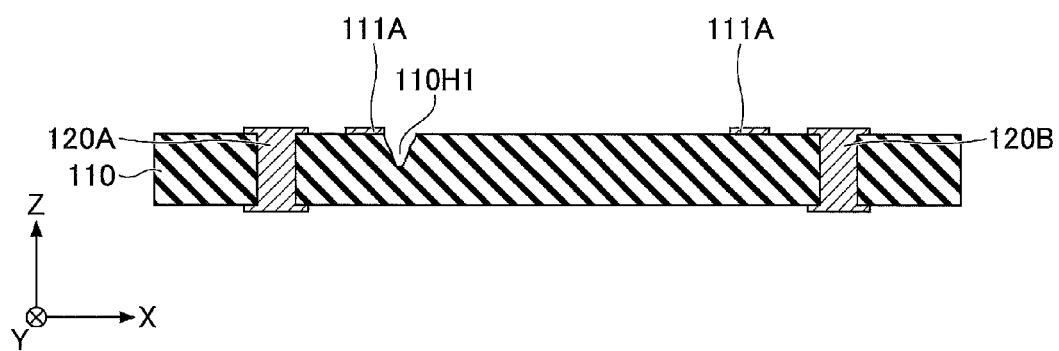

As illustrated in FIGS. 4A and 4B, the core 110 having the wiring layer 111A and the through electrodes 120A and 120B is provided, and, then, a laser process is utilized to form the penetrating hole 110H (see FIGS. 2A and 2B).

For example, the diameter and power of the laser beam are set such that one laser shot creates a hole 110H1 as illustrated in FIGS. 4A and 4B. The hole 110H1 is approximately one third of the width of the penetrating hole 110H in the Y-axis direction as illustrated in FIG. 4A, and has a depth slightly deeper than half the thickness of the core 110. As illustrated in FIG. 4B, the hole 110H1 has a cross-section thereof whose horizontal span decreases toward the bottom as illustrated in FIG. 4B. Such a shape of the hole 110H1 is made by a laser process.

The position of a laser shot is shifted successively as illustrated by dotted-line circles illustrated in FIG. 4A in the area where the penetrating hole 110H is created, and, then, the core 110 is flipped over for a similar laser process to be performed, thereby creating the penetrating hole 110H.

When laser shots impact on the core 110 from both surfaces thereof, the diameter and power of the laser beam may be adjusted to leave the projecting part 110A on the inner wall of the penetrating hole 110H. With this arrangement, the penetrating hole 110H having the projecting part 110A is formed in the core 110.

In the example described above, the penetrating hole 110H is formed through the core 110 having the wiring layer 111A and the through electrodes 120A and 120B. Alternatively, the penetrating hole 110H may be formed first through the core 110, and, then, the wiring layer 111A and the through electrodes 120A and 120B may be formed.

Figure 5A:
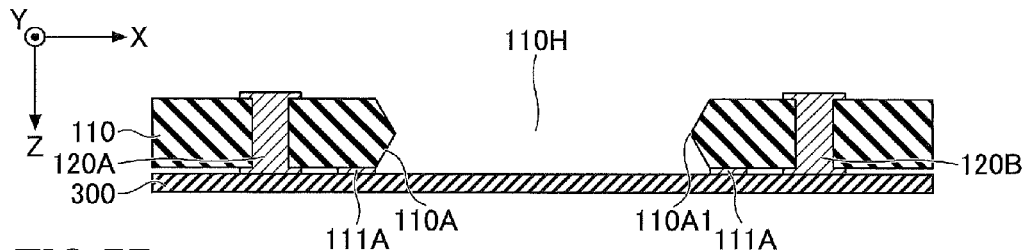
FIGS. 5A through 5E are drawings illustrating a method of making the wiring substrate of the embodiment.

After the process described above, the core 110 is flipped over as illustrated in FIG. 5A. A tentative tape 300 is then attached to the surface of the core 110 on which the wiring layer 111A is formed. The tentative tape 300 has an adhesive layer on a surface thereof that is the upper surface in FIG. 5A. The tentative tape 300 may be made of a resin film such as PET (Polyethylene terephthalate).

Figure 5B:
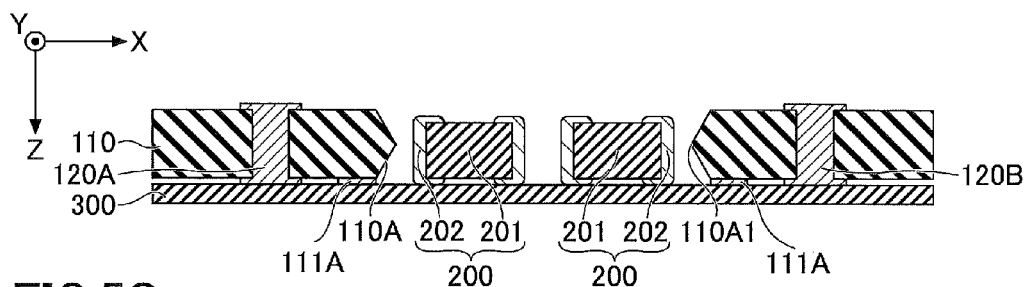

As illustrated in FIG. 5B, the capacitor chips 200 are inserted into the penetrating hole 110H of the core 110. In so doing, the electrodes 202 of the capacitor chips 200 are engaged with the ridge 110A1 of the projecting part 110A situated on the positive-Y-direction side and the ridge 110A1 of the projecting part 110A situated on the negative-Y-direction side (see FIGS. 3A through 3C). In this state, the capacitor chips 200 are bonded to the tentative tape 300. This serves to secure the capacitor chips 200 tentatively.

Figure 5C:
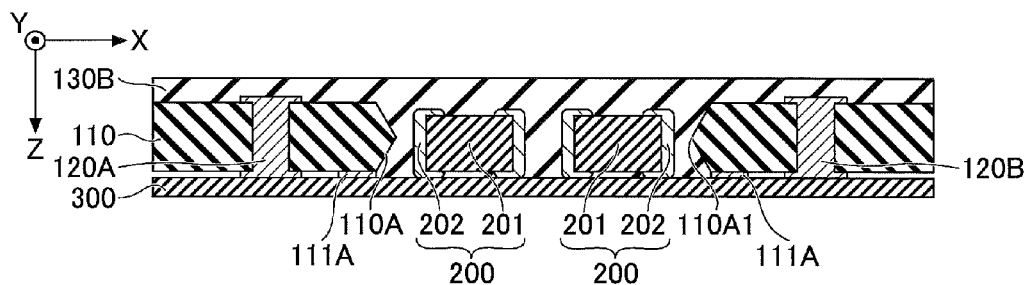

As illustrated in FIG. 5C, molten resin material is used to fill the penetrating hole 110H and also to cover the core 110, the through electrodes 120A and 120B, and the capacitor chips 200. In so doing, a resin film is placed on the core 110 to cover the penetrating hole 110H, and is melted by heat. The resin material is then heated and subjected to pressure to thermally cure, thereby forming the insulating layer 130B.

In this process step, the capacitor chips 200 are supported by the projecting part 110A and tentatively secured by the tentative tape 300, so that positional displacement does not occur with respect to the capacitor chips 200. Physical contact between the capacitor chips 200 is thus prevented to ensure insulation between the capacitor chips 200.

The wiring layer 111A has a hollow rectangular shape (i.e., rectangular loop shape) in the plan view to surround the penetrating hole 110H, so that the insulating layer 130B is prevented from entering areas outside the wiring layer 111A. If the intrusion of the insulating layer 130B is not a problem or does not occur, the wiring layer 111A fully circling around the penetrating hole 110H does not have to be provided.

Figure 5D:
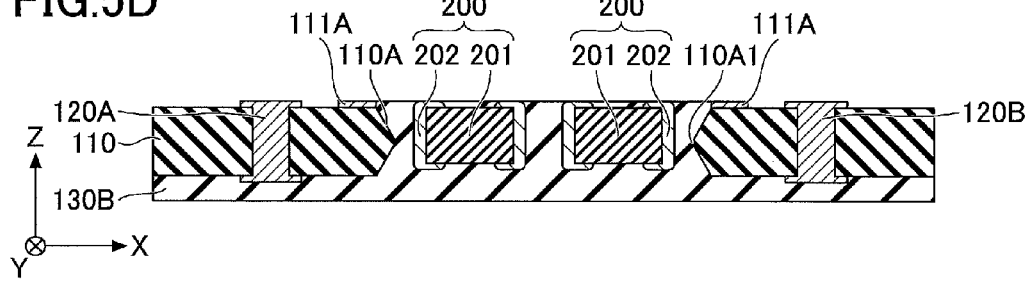

Subsequently, the tentative tape 300 is removed, followed by flipping over the core 110 again as illustrated in FIG. 5D.

Figure 5E:
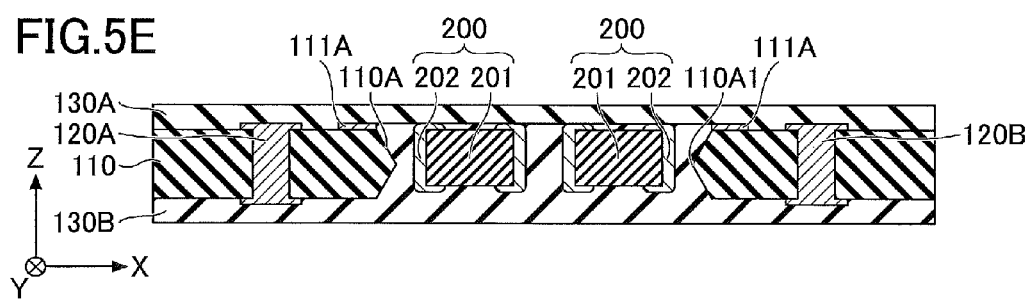

As illustrated in FIG. 5E, the insulating layer 130A is formed to cover the upper faces of the core 110, the wiring layer 111A, the through electrodes 120A and 120B, and the capacitor chips 200. The insulating layer 130A is formed by heating and applying pressure to the same resin material as that of the insulating layer 130B for thermal curing.

In this process step, the capacitor chips 200 are held by the projecting part 110A and the insulating layer 130B, so that positional displacement does not occur with respect to the capacitor chips 200. Physical contact between the capacitor chips 200 is thus prevented to ensure insulation between the capacitor chips 200. In the process steps illustrated in FIG. 5C through 5E, the capacitor chips 200 are encapsulated in the insulating layers 130A and 130B.

Figure 6A:
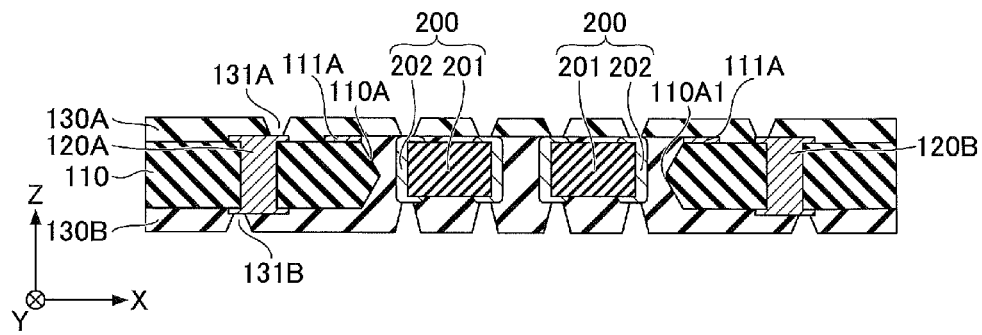
FIGS. 6A through 6C are drawings illustrating a method of making the wiring substrate of the embodiment.

Subsequently, via holes 131A and 131B are formed as illustrated in FIG. 6A. The via holes 131A are formed by a laser process, for example, at the positions where the vias 140A1 through 140A6 will be formed later. With the core 110 being flipped over, the via holes 131B are formed by a laser process, for example, at the positions where the vias 140B1 through 140B6 will be formed later.

Figure 6B:
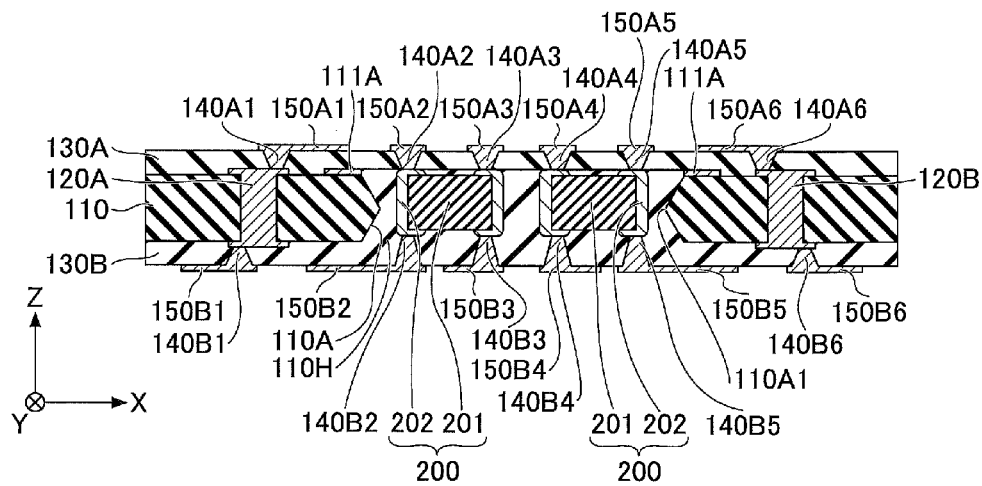

As illustrated in FIG. 6B, the vias 140A1 through 140A6, the vias 140B1 through 140B6, the wiring layer segments 150A1 through 150A6, and the wiring layer segments 150B1 through 150B6 will be formed.

The vias 140A1 through 140A6 and the vias 140B1 through 140B6 may be formed inside the via holes 131A and 131B, respectively, by use of a semi-additive process, for example, The vias 140A1 through 140A6 are formed simultaneously, and the vias 140B1 through 140B6 are formed simultaneously.

The wiring layer segments 150A1 through 150A6 and the wiring layer segments 150B1 through 150B6 are formed integrally with the vias 140A1 through 140A6 and the vias 140B1 through 140B6, respectively, by use of a semi-additive method performed immediately after the plating process forming these vias.

Figure 6C:
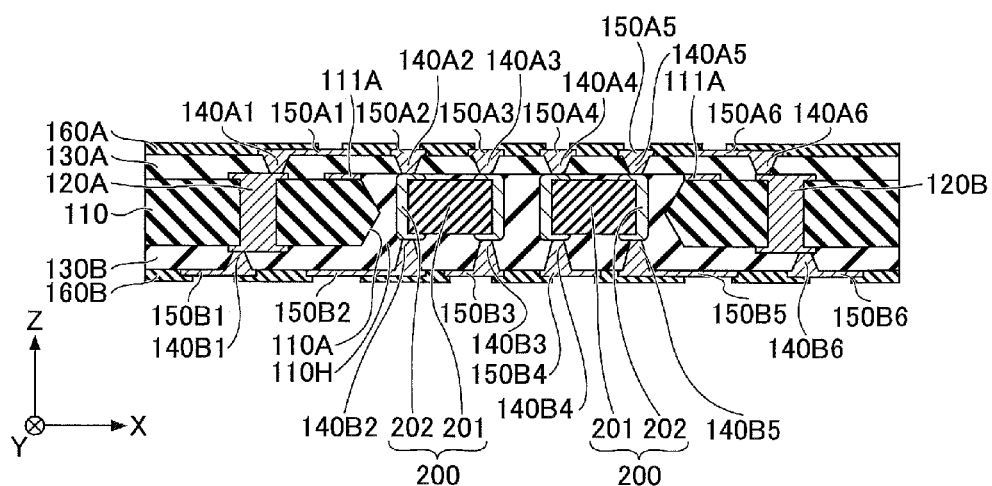

Subsequently, the solder resist layers 160A and 160B are formed as illustrated in FIG. 6C.

The solder resist layer 160A is formed by placing resist material all over the insulating layer 130A and the wiring layer segments 150A1 through 150A6 and by exposing through exposure and development processes the portions of the wiring layer segments 150A1 through 150A6 that are to be used as terminals. The resist material is photosensitive epoxy resin or photosensitive acrylic resin.

Similarly, the solder resist layer 160B is formed by placing resist material all over the insulating layer 130B and the wiring layer segments 150B1 through 150B6 and by exposing through exposure and development processes the portions of the wiring layer segments 150B1 through 150B6 that are to be used as terminals.

With this, the process of making the wiring substrate 100 of the present embodiment comes to an end.

Figure 7:
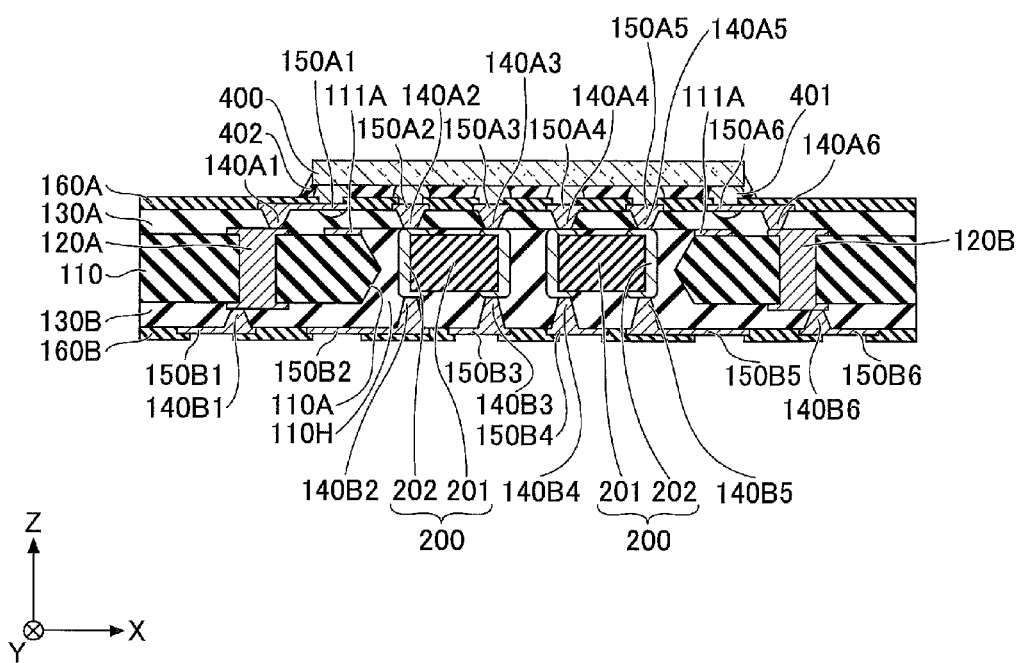
FIG. 7 is a drawing illustrating the wiring substrate and an LSI chip formed thereon.

FIG. 7 is a drawing illustrating the wiring substrate 100 and an LSI chip 400 formed thereon.

As illustrated in FIG. 7, the LSI chip 400 may be mounted through bumps 401 on the portions of the wiring layer segments 150A1 through 150A6 that are used as terminals. Underfill resin 402 may be placed to fill the gap under the LSI chip 400.

According to the present embodiment, the capacitor chips 200 are securely positioned through engaging contact with the projecting part 110A of the inner wall of the penetrating hole 110H, followed by forming the insulating layers 130A and 130B and the solder resist layers 160A and 160B.

This arrangement prevents the capacitor chips 200 arranged side by side in the X-axis direction from being displaced, thereby preventing short-circuiting caused by physical contact between the electrodes 202, and also preventing the electrodes 202 from failing to be properly connected to the vias 140A1 through 140A6 and the vias 140B1 through 140B6.

Accordingly, the wiring substrate 100 and a method of making the wiring substrate 100 are provided that ensure improved electrical reliability with respect to the two capacitor chips 200 disposed in the single penetrating hole 110H.

It may be noted that mounting a semiconductor chip such as a CPU operating at high frequency on the wiring substrate 100 may require a large number of capacitor chips 200 to be used for the purpose of improving electrical characteristics.

Each capacitor chip 200 may be disposed in a different penetrating hole 110H when providing a large number of capacitor chips 200. Such an arrangement, however, ends up having a large number of penetrating holes 110H, which occupy a large area in the wiring substrate 100. The presence of such penetrating holes 110H means reduced freedom in wiring placement. Further, since a large number of penetrating holes 110H are provided, the horizontal area size of the wiring substrate 100 may need to be increased.

In order to obviate the problems noted above, the present embodiment uses a single penetrating hole 110H to accommodate a plurality of capacitor chips 200.

Provision may be made such that a plurality of penetrating holes 110H are provided.

The description provided heretofore has been directed to a case in which the two capacitor chips 200 are disposed in the single penetrating hole 110H. This is not a limiting example, and the number of capacitor chips 200 disposed in the single penetrating hole 110H may be any number that is two or more.

The description provided heretofore has also been directed to a case in which the capacitor chips 200 are disposed in the penetrating hole 110H.

This is not a limiting example. What is disposed in the penetrating hole 110H is not limited to the capacitor chips 200, and may be any electronic components that have terminals or the like on an outer face thereof. For example, a plurality of CPU (central processing unit) chips or memory chips may be disposed in the penetrating hole 110H.

Further, the description provided heretofore has been directed to a case in which the penetrating hole 110H is formed by a laser process, and the projecting part 110A is what is left of the core 110 at the center thereof in the thickness direction after the laser process. This is not a limiting example, and the penetrating hole 110H may be formed by routing or by another mechanical process.

Moreover, the description provided heretofore has been directed to a case in which the main bodies 201 of the capacitor chips 200 are not in contact with the projecting part 110A. This is not a limiting example, and the main bodies 201 may be held directly by the projecting part 110A as long as the electrical characteristics of the capacitor chips 200 are not compromised.

Further, the description provided heretofore has been directed to a case in which the projecting part 110A has a hollow rectangular shape (i.e., rectangular loop shape) formed along the inner walls of the penetrating hole 110H. This is not a limiting example, and the projecting part 110A does not have to have a loop shape formed along the inner walls of the penetrating hole 110H. The projecting part 110A may be formed at only some part of the penetrating hole 110H. The projecting part 110A may have a shape as illustrated in FIG. 8, which will be described later.

The description provided heretofore has been directed to a case in which the penetrating hole 110H is formed such as to provide spaces on the positive-X-direction side and negative-X-direction side of the two capacitor chips 200. This is not a limiting example. As long as placing the capacitor chips 200 in the penetrating hole 110H is not hampered, no space may be provided on either the positive-X-direction side or the negative-X-direction side of the two capacitor chips 200.

Further, the description provided heretofore has been directed to the wiring substrate 100 in which only the insulating layers 130A and 130B are formed on the upper surface and lower surface of the core 110, respectively, as insulating layers. This is not a limiting example, and the wiring substrate 100 may include one or more other insulating layers in addition to the insulating layers 130A and 130B, and may also include a plurality of wiring layers.

Figure 8A:
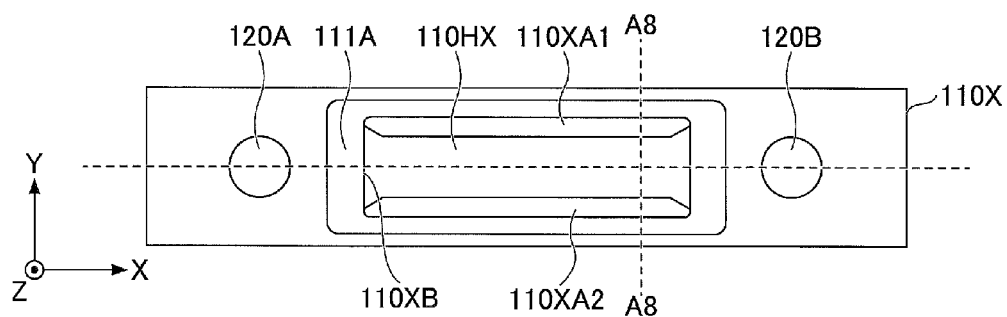
FIGS. 8A through 8C are cross-sectional views of a core that is a variation of the embodiment.
Figure 8B:
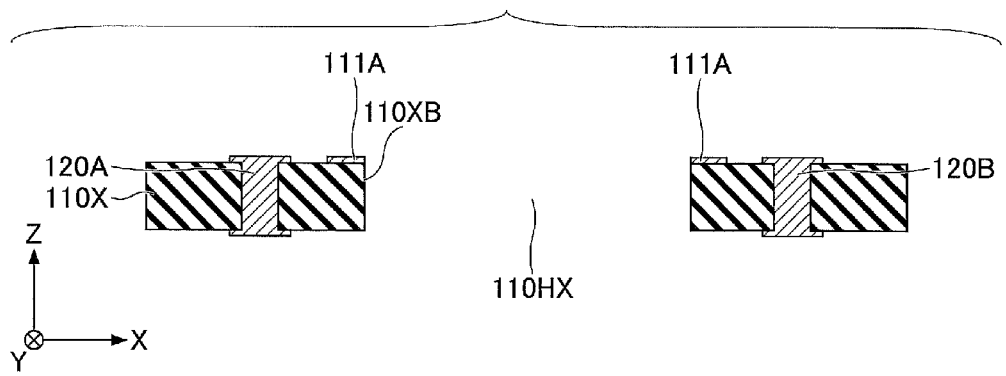
Figure 8C:
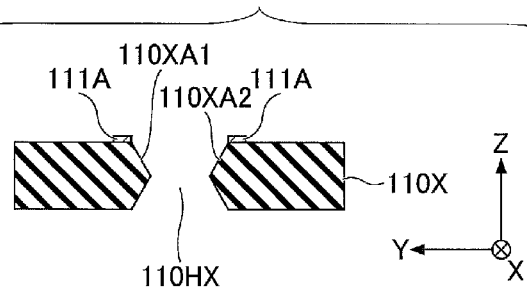

FIGS. 8A through 8C are cross-sectional views of a core 110X that is a variation of the above-described embodiment. FIGS. 8A through 8C correspond to FIGS. 2A through 2C, respectively.

A penetrating hole 110HX formed through the core 110X has projecting parts 110XA1 and 110XA2. The projecting parts 110XA1 and 110XA2 project toward the inner space of the penetrating hole 110HX from the inner walls of the penetrating hole 110HX extending in the X-axis direction in the plan view, and the cross-section thereof has a tapered shape as illustrated in FIG. 8C. No projecting part is formed on the inner walls 110XB of the penetrating hole 110HX extending in the Y-axis direction.

The projecting parts 110XA1 and 110XA2 having a tapered shape may be similar to what is left of the projecting part 110A illustrated in FIGS. 2A through 2C after removing the part thereof formed on the inner walls of the penetrating hole 110H extending in the Y-axis direction. The projecting amount of the projecting parts 110XA1 and 110XA2 decreases toward each of the four corners of the penetrating hole 110HX in the plan view.

When the two capacitor chips 200 are disposed in the penetrating hole 110HX, the side surface facing toward the positive Y direction and the side surface facing toward the negative Y direction of these two capacitor chips 200 are placed in engaging contact with the projecting parts 110XA1 and 110XA2, respectively. This arrangement is similar to an arrangement in which the projecting part 110A illustrated in FIGS. 2A through 2C is placed in engaging contact with the side surface facing toward the positive Y direction and the side surface facing toward the negative Y direction of the two capacitor chips 200.

Since no projecting part is formed on the inner walls 110XB of the penetrating hole 110HX extending in the Y-axis direction, the arrangement illustrated in FIGS. 8A through 8C may make it easier than the arrangement illustrated in FIGS. 2A through 2C to place the capacitor chips 200 in the penetrating hole 110HX, depending on the shape of the capacitor chips 200.

Further, since no projecting part is formed on the inner walls 110XB of the penetrating hole 110HX extending in the Y-axis direction, the length of the penetrating hole 110HX in the X-axis direction can be set shorter than the length of the penetrating hole 110H illustrated in FIGS. 2A through 2C.

It may be noted that the arrangement having no projecting part formed on the inner walls 110XB of the penetrating hole 110HX extending in the Y-axis direction may be formed by removing by use of a laser process the portions of the projecting part 110A situated on the inner walls of the penetrating hole 110H extending in the Y-axis direction illustrated in FIGS. 2A through 2C.

The descriptions of a wiring substrate and a method of making the wiring substrate according to exemplary embodiments have been provided heretofore. The present invention is not limited to these embodiments, but various variations and modifications may be made without departing from the scope of the present invention.

According to at least one embodiment, a wiring substrate and a method of making the wiring substrate are provided that ensure improved electrical reliability with respect to a plurality of electronic components disposed in a single penetrating hole.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A wiring substrate, comprising:
   a core layer having a hole penetrating therethrough in a thickness direction thereof, and having a projecting part projecting from an inner wall of the hole toward an inner space of the hole;
   a plurality of electronic components disposed in the hole and arranged side by side at a spaced interval in a plan view, the electronic components having side portions thereof, the side portions being engaged with the projecting part; and
   a resin layer filling the hole and supporting the electronic components.

2. The wiring substrate as claimed in claim 1, wherein the projecting part includes one or more projecting parts projecting from one or more inner walls of the hole toward the inner space of the hole, and the plan view is defined in a plane perpendicular to the thickness direction, and wherein the side portions of the electronic components face sideways relative to a direction in which the electronic components are arranged.

3. The wiring substrate as claimed in claim 2, wherein the hole has a rectangular shape in the plan view, and the one or more projecting parts include at least two opposite projecting parts projecting from two respective opposite inner walls, among the inner walls, situated sideways relative to the direction in which the electronic components are arranged, and wherein the side portions of the electronic components include two opposite side portions of each of the electronic components, the two opposite side portions being engaged with the two opposite projecting parts, respectively.

4. The wiring substrate as claimed in claim 3, wherein the one or more projecting parts are one projecting part having a rectangular loop shape formed along the inner walls of the hole having the rectangular shape in the plan view, and the side portions of the electronic components include the two opposite side portions of each of the electronic components, the two opposite side portions being engaged with two opposite portions of the one projecting part, respectively.

5. The wiring substrate as claimed in claim 3, wherein the hole has a rectangular shape in the plan view, and the one or more projecting parts are the two opposite projecting parts projecting from the two respective opposite inner walls situated sideways relative to the direction in which the electronic components are arranged, and wherein the side portions of the electronic components are the two opposite side portions of each of the electronic components, the two opposite side portions being engaged with the two opposite projecting parts, respectively.

6. The wiring substrate as claimed in claim 2, wherein a cross-section of a given one of the one or more projecting parts as taken along a plane parallel to both the thickness direction and a direction in which the given one of the one or more projecting parts projects has a tapered shape such that a tip of the tapered shape is situated away from two surfaces of the core layer opposite to each other in the thickness direction.

7. The wiring substrate as claimed in claim 2, wherein each of the electronic components has a cuboid shape with electrodes disposed on opposite ends thereof opposite to each other in the direction in which the electronic components are arranged, the electrodes having side portions thereof engaged with the one or more projecting parts.

8. The wiring substrate as claimed in claim 2, wherein each of the electronic components has a cuboid shape, and the electronic components are arranged side by side in the longitudinal direction thereof.

9. The wiring substrate as claimed in claim 2, wherein the electronic components are capacitor chips.

10. A method of making a wiring substrate, comprising:
    forming a hole penetrating through a core layer in a thickness direction thereof, the core layer having a projecting part projecting from an inner wall of the hole toward an inner space of the hole;
    disposing a plurality of electronic components in the hole such that the electronic components are arranged side by side at a spaced interval in a plan view, the electronic components having side portions thereof, the side portions being engaged with the projecting part; and
    filling the hole with resin material to form a resin layer that supports the electronic components.

11. The method as claimed in claim 10, wherein the step of forming the hole includes forming the hole from two surfaces of the core layer opposite to each other in the thickness direction, and the projecting part includes one or more projecting parts projecting from one or more inner walls of the hole toward the inner space of the hole, and wherein the plan view is defined in a plane perpendicular to the thickness direction, and the side portions of the electronic components face sideways relative to a direction in which the electronic components are arranged.

* * * * *